United States Patent
Kamiyama

(10) Patent No.: US 10,453,781 B2
(45) Date of Patent: Oct. 22, 2019

(54) SEMICONDUCTOR DEVICE

(71) Applicant: SHINDENGEN ELECTRIC MANUFACTURING CO., LTD., Tokyo (JP)

(72) Inventor: Yoshihiro Kamiyama, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 324 days.

(21) Appl. No.: 15/513,396

(22) PCT Filed: Mar. 11, 2016

(86) PCT No.: PCT/JP2016/057712
§ 371 (c)(1),
(2) Date: Mar. 22, 2017

(87) PCT Pub. No.: WO2017/154189
PCT Pub. Date: Sep. 14, 2017

(65) Prior Publication Data
US 2018/0233437 A1 Aug. 16, 2018

(51) Int. Cl.
H01L 23/495 (2006.01)
H01L 21/44 (2006.01)
H01L 23/31 (2006.01)

(52) U.S. Cl.
CPC .... *H01L 23/49562* (2013.01); *H01L 23/3121* (2013.01); *H01L 23/4952* (2013.01);
(Continued)

(58) Field of Classification Search
CPC .................................................. H01L 23/49555
(Continued)

(56) References Cited

U.S. PATENT DOCUMENTS 7,679,182 B2 * 3/2010 Yoshinari .......... H01L 23/49531
257/207
8,796,816 B2 * 8/2014 Hayashi ............ H01L 23/49537
257/532

(Continued)

FOREIGN PATENT DOCUMENTS

JP 5067679 B2 11/2012
JP 2014029944 A 2/2014

OTHER PUBLICATIONS

Search Report and Opinion for Dutch application No. 2018505 dated Oct. 12, 2017, with translation provided by foreign associate.
(Continued)

*Primary Examiner* — Calvin Lee
(74) *Attorney, Agent, or Firm* — Ladas & Parry, LLP

(57) ABSTRACT

A semiconductor device comprises a plurality of first conductor portions 10, a plurality of second conductor portions 20 and a sealing portion 50, covering upper surfaces of the first conductor portion 10 and the second conductor portion 20. The first conductor portion 10 and the second conductor portion 20 are connected. Usage mode of the first terminal 11 and the second terminal 12 can be selected, and the second terminal 21 of the second conductor portion 20 serves as an output terminal in a case where the first terminal 11 of the first conductor portion 10 is used as a power supply terminal, and the first terminal 11 of the first conductor portion 10 serves as an output terminal in a case where the second terminal 21 is used as a power supply terminal.

9 Claims, 10 Drawing Sheets

(52) U.S. Cl.
CPC .. *H01L 23/49524* (2013.01); *H01L 23/49541* (2013.01); *H01L 23/49555* (2013.01); *H01L 23/49568* (2013.01); *H01L 23/49575* (2013.01); *H01L 2224/37147* (2013.01); *H01L 2224/40245* (2013.01); *H01L 2224/45124* (2013.01); *H01L 2224/48247* (2013.01); *H01L 2224/4903* (2013.01); *H01L 2224/49111* (2013.01); *H01L 2224/73221* (2013.01); *H01L 2924/1815* (2013.01)

(58) Field of Classification Search
USPC ................ 438/611, 617; 257/675, 735, 784
See application file for complete search history.

(56) References Cited

U.S. PATENT DOCUMENTS

| | | | |
|---|---|---|---|
| 9,123,711 B2* | 9/2015 | Fujita | H01L 23/4952 257/669 |
| 9,129,949 B2* | 9/2015 | Asada | H01L 23/49524 257/675 |
| 9,196,561 B2* | 11/2015 | Fujita | H01L 25/072 257/712 |
| 2007/0267742 A1 | 11/2007 | Tai | |
| 2011/0285226 A1 | 11/2011 | Fujita et al. | |
| 2011/0291236 A1 | 12/2011 | Hayashi et al. | |
| 2013/0032855 A1 | 2/2013 | Macheiner et al. | |
| 2013/0221516 A1 | 8/2013 | Asada et al. | |
| 2013/0307129 A1 | 11/2013 | Fujita et al. | |
| 2015/0035136 A1 | 2/2015 | Fujita | |
| 2015/0326221 A1 | 11/2015 | Totani | |

OTHER PUBLICATIONS

International Search Report for PCT/JP2016/057712 dated May 24, 2015 and its English translation provided by WIPO.

* cited by examiner

SEMICONDUCTOR DEVICE

CROSS-REFERENCE TO RELATED APPLICATION

The present application is the U.S. national phase of PCT Application PCT/JP2016/057712 filed on Mar. 11, 2016, the disclosure of which is incorporated herein by reference in its entirety.

TECHNICAL FIELD

The present invention relates to a semiconductor device.

BACKGROUND ART

Conventionally, semiconductor devices used in inverter circuits and relay circuits employed in vehicles such as automobiles are known. JP 5067679 B1 discloses a semiconductor device having a power supply terminal, an output terminal, and a ground terminal.

SUMMARY OF INVENTION

Technical Problem

In a conventional semiconductor device, as disclosed in JP 5067679 B1, a predetermined terminal functions as a power supply terminal, and another terminal functions as an output terminal. Accordingly, it has not been possible to appropriately change therebetween since the predetermined terminal functions as a power supply terminal and another terminal functions as an output terminal.

The present invention has been made in view of the foregoing. The present invention provides a semiconductor device capable of allowing an appropriate selection of a terminal functioning as a power supply terminal and a terminal functioning as an output terminal.

Solution to Problem

A semiconductor device according to the present invention comprises:

a plurality of first conductor portions, having a first terminal, a first main body portion being integrated with the first terminal and a first electronic element being provided on the first main body portion;

a plurality of second conductor portions, having a second terminal, a second main body portion being is integrated with the second terminal and a second electronic element being provided on the second main body portion; and a sealing portion, covering upper surface of the first conductor portion and the second conductor portion, wherein the first conductor portion and the second conductor portion are connected, and wherein usage mode of the first terminal and the second terminal can be selected by changing connection aspect of the first conductor portion and the second conductor portion, and the second terminal serves as an output terminal in a case where the first terminal is used as a power supply terminal and the first terminal serves as an output terminal in a case where the second terminal is used as a power supply terminal.

In the semiconductor device according to the present invention, back surfaces of the first conductor portion and the second conductor portion may be exposed from the sealing portion.

In the semiconductor device according to the present invention, the first main body portion and the second main body portion may have a substantially L-shape when viewed from back surface side.

In the semiconductor device according to the present invention, a plurality of the first main body portions may have the same shape respectively when viewed from back surface, and a plurality of second main body portions may have the same shape respectively when viewed from the back surface.

In the semiconductor device according to the present invention, area of part, exposed from the sealing portion, of the first main body portion and area of part, exposed from the sealing portion, of the second main body portion may be substantially the same when viewed from back surface.

In the semiconductor device according to the present invention, the first electronic element and the second main body portion may be connected via a connector, or the second electronic element and the first main body portion may be connected via a connector.

In the semiconductor device according to the present invention, lengths of a plurality of the connectors may be the same.

The semiconductor device, according to the present invention, may further comprise a third conductor portions, having a third terminal and a third main body portion integrated with the third terminal, wherein the third conductor portion may be directly connected to the first electronic element or the second electronic element.

In the semiconductor device according to the present invention, the third terminal may be a ground terminal.

In the semiconductor device according to the present invention, the first terminal and the second terminal may be bent toward front surface side, and the first main body portion, the second main body portion, an unbent portion of the first terminal and an unbent portion of the second terminal may be flush with each other on back surface side.

In the semiconductor device according to the present invention, a plurality of the first electronic elements and a plurality of the second electronic elements may be evenly arranged when viewed from front surface side.

Advantageous Effects of Invention

According to the present invention, the usage mode of the first terminal and the second terminal can be selected by changing the connection aspect of the first conductor portion and the second conductor portion. In a case where the first terminal is used as a power supply terminal, the second terminal serves as an output terminal. In a case where the second terminal is used as a power supply terminal, the first terminal serves as an output terminal. Accordingly, a terminal functioning as a power supply terminal and a terminal functioning as an output terminal can be selected appropriately.

DESCRIPTION OF EMBODIMENTS

Embodiment

<<Configuration>>

Figure 1:
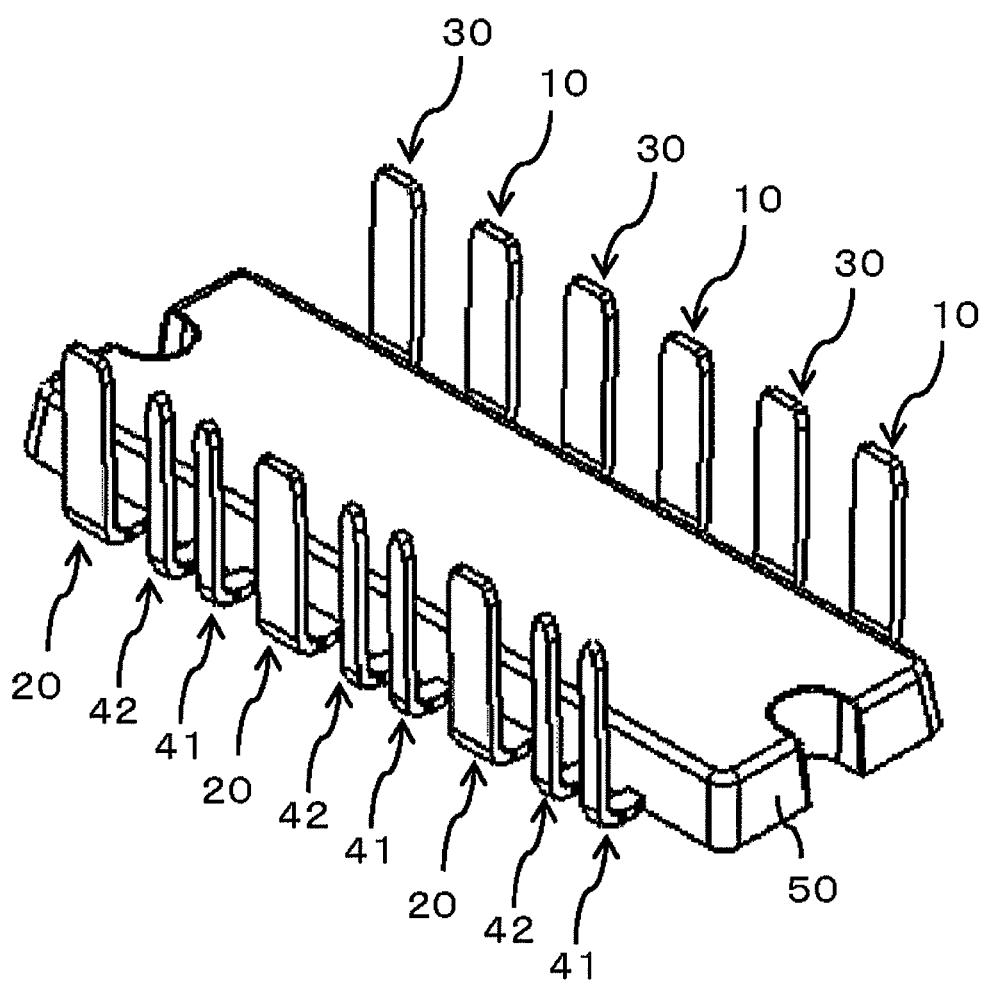
FIG. 1 is a perspective view, as viewed from a front surface side, of a semiconductor device according to an embodiment of the present invention.
Figure 2:
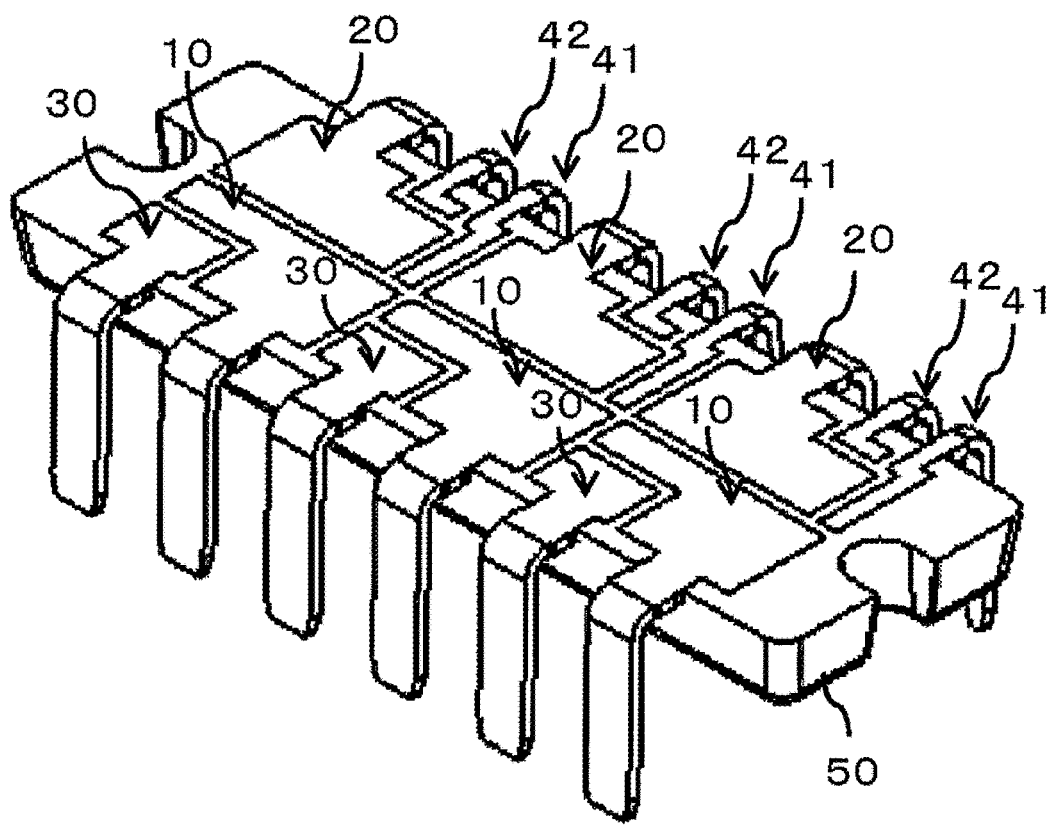
FIG. 2 is a perspective view, as viewed from a back surface side, of the semiconductor device according to the embodiment of the present invention.
Figure 3:
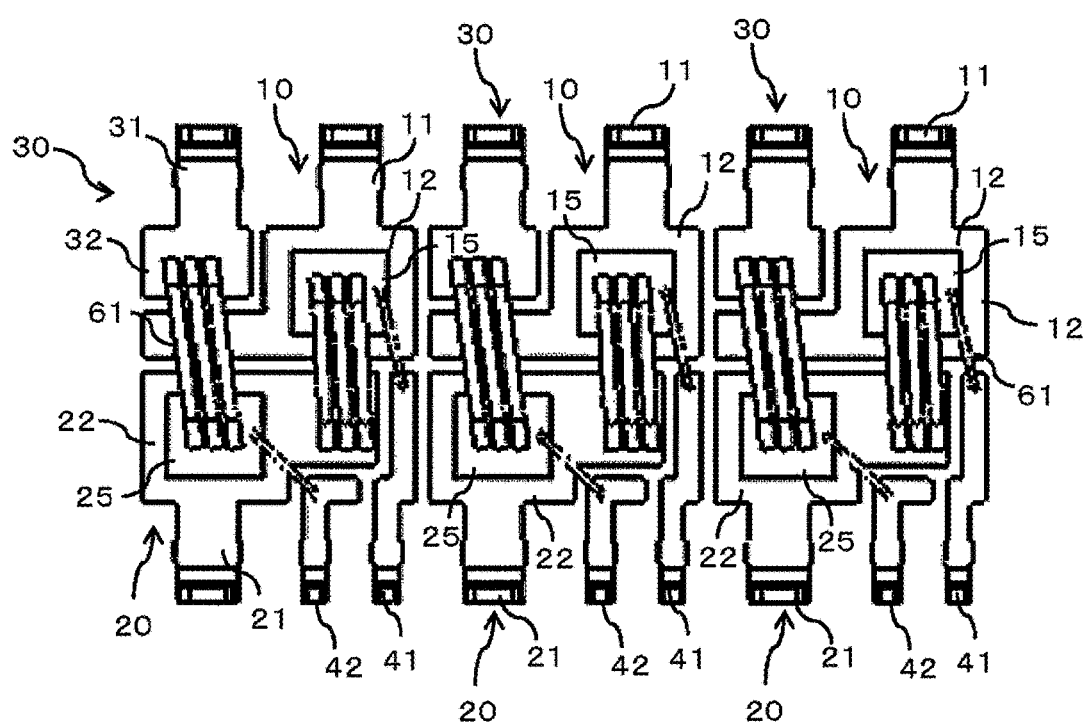
FIG. 3 is an upper plan view illustrating a connection aspect in a semiconductor device according to a first aspect of the embodiment of the present invention.
Figure 4:
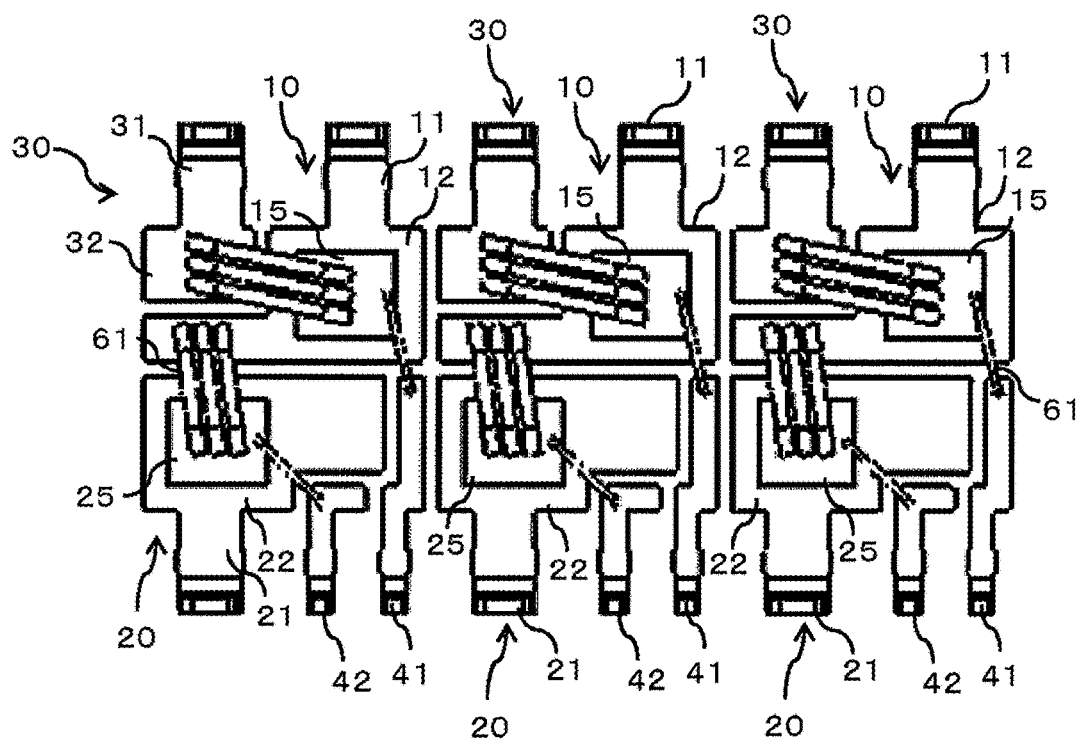
FIG. 4 is an upper plan view illustrating a connection aspect in a semiconductor device according to a second aspect of the embodiment of the present invention.

As illustrated in FIGS. 1 and 2, a semiconductor device according to the present embodiment has a plurality of first conductor portions 10, a plurality of second conductor portions 20, and a sealing portion 50. The sealing portion 50 covers upper surfaces of the first conductor portions 10 and the second conductor portions 20. As illustrated in FIGS. 3 and 4, the first conductor portion 10 has a first terminal 11, a first main body portion 12, and a first electronic element 15. The first main body portion 12 is integrated with the first terminal 11. The first electronic element 15 is provided on the first main body portion 12. The second conductor portion 20 has a second terminal 21, a second main body portion 22, and a second electronic element 25. The second main body portion 22 is integrated with the second terminal 21. The second electronic element 25 is provided on the second main body portion 22. The first main body portions 12 and the second main body portions 22 are formed of, for example, a copper alloy, and may be subjected to tin plating treatment, nickel plating treatment, or the like on the entire surfaces or part thereof. As the sealing portion 50, an epoxy resin or the like may be used.

Figure 5:
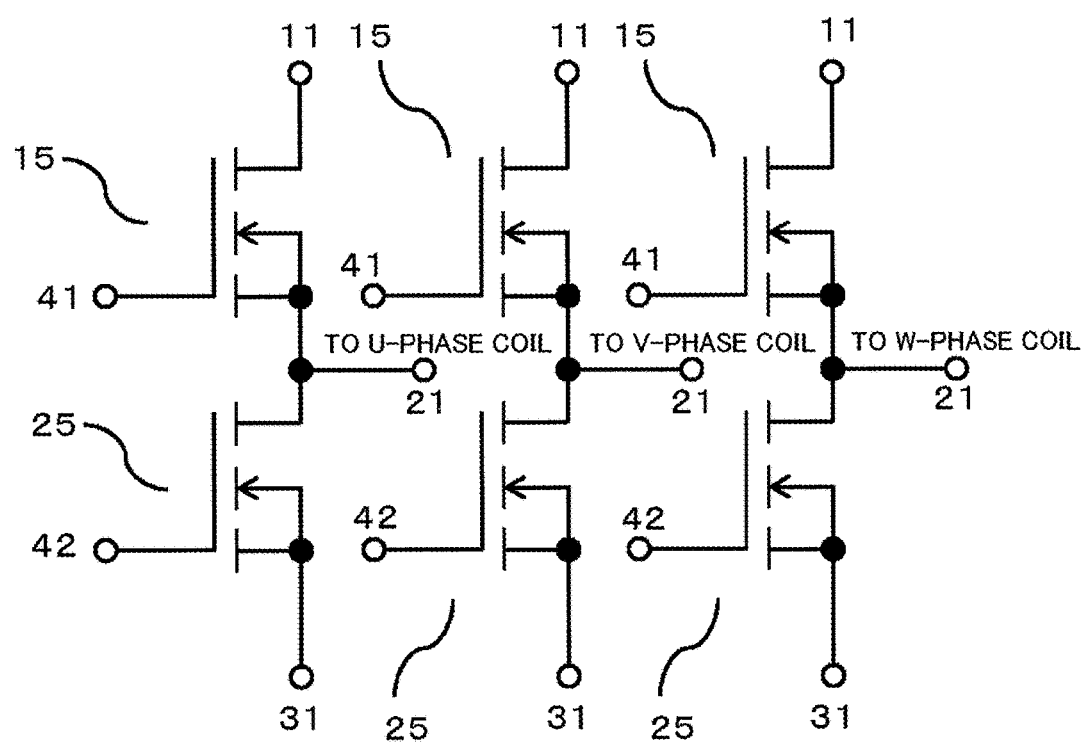
FIG. 5 is a circuit diagram of the semiconductor device according to the first aspect of the embodiment of the present invention.
Figure 6:
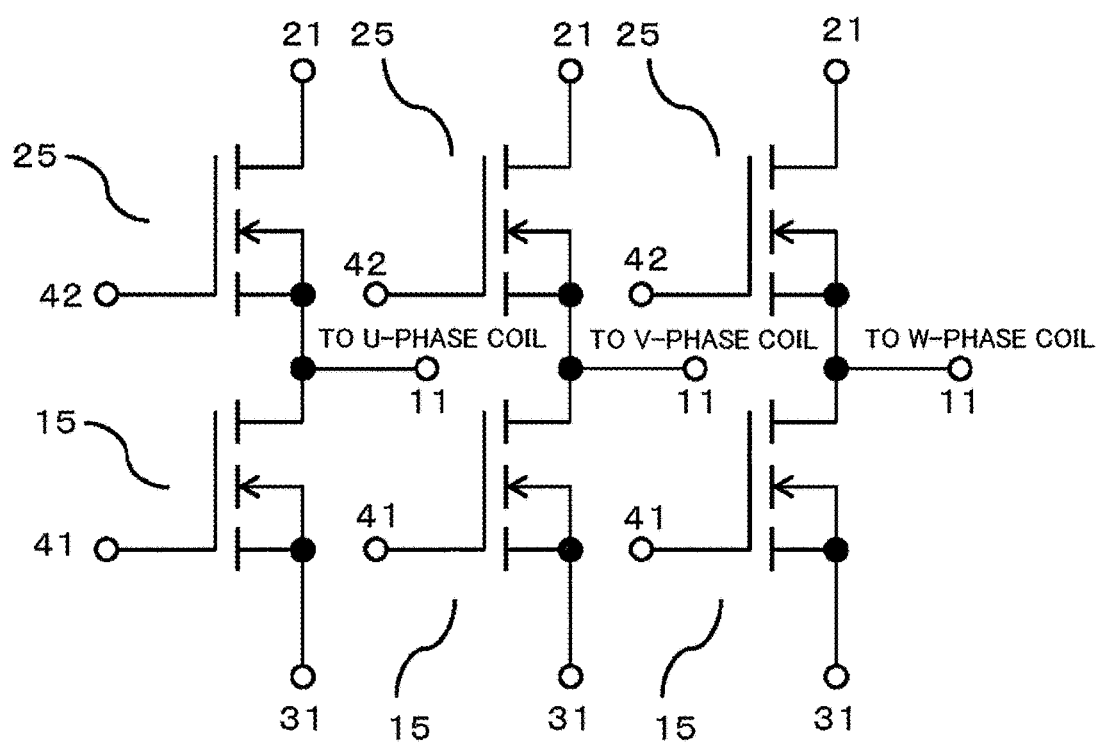
FIG. 6 is a circuit diagram of the semiconductor device according to the second aspect of the embodiment of the present invention.

As the semiconductor device according to the present embodiment, a power semiconductor device may be used, for example. As the first electronic elements 15 and the second electronic elements 25, metal-oxide semiconductor field-effect transistors (MOSFETs) may be used, for example. Circuit diagrams of the semiconductor device according to the present embodiment are, for example, as illustrated in FIGS. 5 and 6. In the aspects illustrated in FIGS. 5 and 6, the first electronic elements 15 and the second electronic elements 25 are the MOSFETs. In a case illustrated in FIG. 5, a drain of the MOSFET serving as the first electronic element 15 is positioned on the first main body portion 12 side (the back side of the sheet face of FIG. 3). A source thereof is positioned on the side opposite to the first main body portion 12 (the front side of the sheet face of FIG. 3). In addition, a drain of the MOSFET serving as the second electronic element 25 is positioned on the second main body portion 22 side (the back side of the sheet face of FIG. 3). A source thereof is positioned on the side opposite to the second main body portion 22 (the front side of the sheet face of FIG. 3). In a case illustrated in FIG. 6, a source of the MOSFET serving as the first electronic element 15 is positioned on the first main body portion 12 side (the front side of the sheet face of FIG. 4). A drain thereof is positioned on the side opposite to the first main body portion 12 (the back side of the sheet face of FIG. 4). In addition, a source of the MOSFET serving as the second electronic element 25 is positioned on the second main body portion 22 side (the front side of the sheet face of FIG. 4). A drain thereof is positioned on the side opposite to the second main body portion 22 (the back side of the sheet face of FIG. 4).

Figure 9:
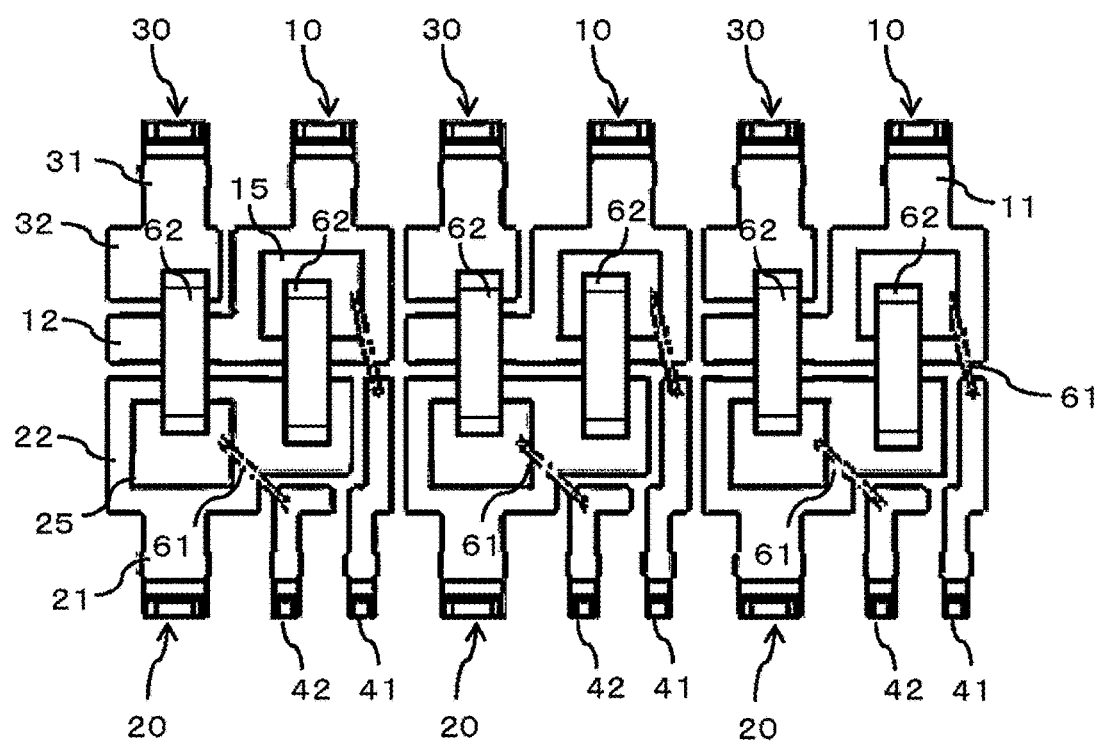
FIG. 9 is an upper plan view illustrating a connection aspect in a semiconductor device according to a modification (an aspect in which connectors are used) of the first aspect of the embodiment of the present invention.
Figure 10:
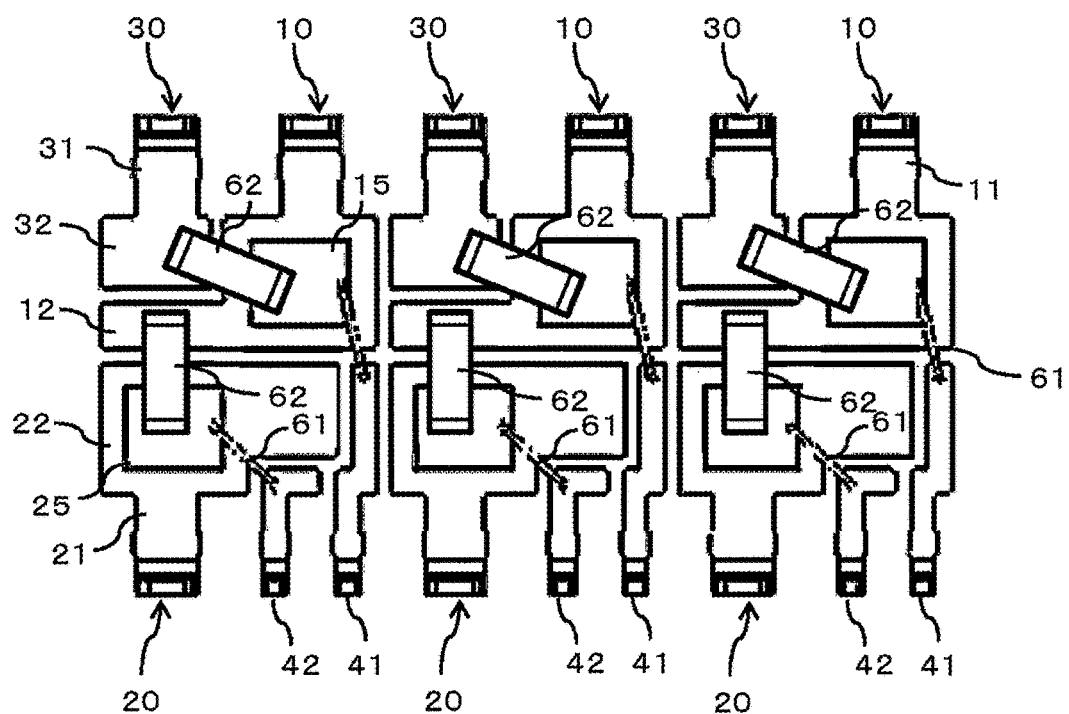
FIG. 10 is an upper plan view illustrating a connection aspect in a semiconductor device according to a modification (an aspect in which connectors are used) of the second aspect of the embodiment of the present invention.

The first conductor portions 10 and the second conductor portions 20 are connected. The first conductor portion 10 and the second conductor portion 20 may be connected via wires 61, as illustrated in FIGS. 3 and 4. Alternatively, the first conductor portion 10 and the second conductor portion 20 may be connected via a connector 62, as illustrated in FIGS. 9 and 10. More specifically, the first electronic element 15 and the second main body portion 22 may be connected via the wires 61, as illustrated in FIG. 3. Alternatively, the second electronic element 25 and the first main body portion 12 may be connected via the wires 61, as illustrated in FIG. 4. The first electronic element 15 and the second main body portion 22 may be connected via the connector 62, as illustrated in FIG. 9. Alternatively, the second electronic element 25 and the first main body portion 12 may be connected via the connector 62, as illustrated in FIG. 10. It is to be noted that for example, a copper clip can be used as the connector 62, while an aluminum wire can be used as the wire 61, for example. It is to be noted that the amount of current to flow can be increased with the use of the connector 62.

In a case where the first terminal 11 is used as a power supply terminal, the second terminal 21 serves as an output terminal (refer to FIG. 5). In a case where the second terminal 21 is used as a power supply terminal, the first terminal 11 serves as an output terminal (refer to FIG. 6). Accordingly, the usage mode of the first terminal 11 and the second terminal 21 can be selected.

Figure 7:
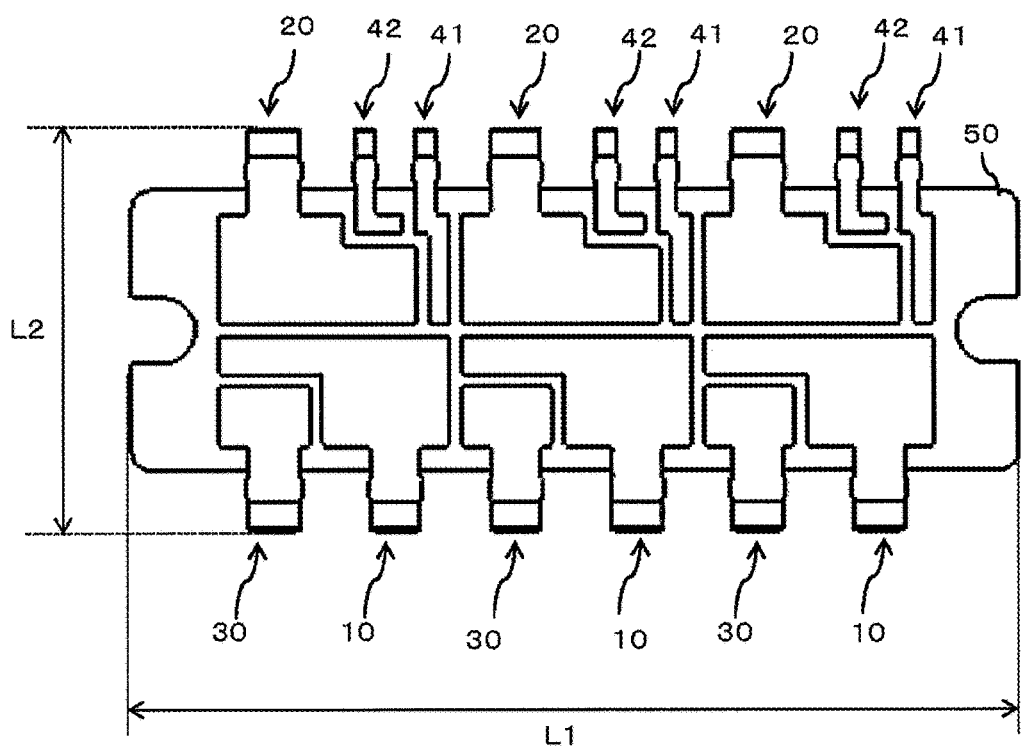
FIG. 7 is a lower plan view illustrating the back surface of the semiconductor device according to the embodiment of the present invention.
Figure 8:
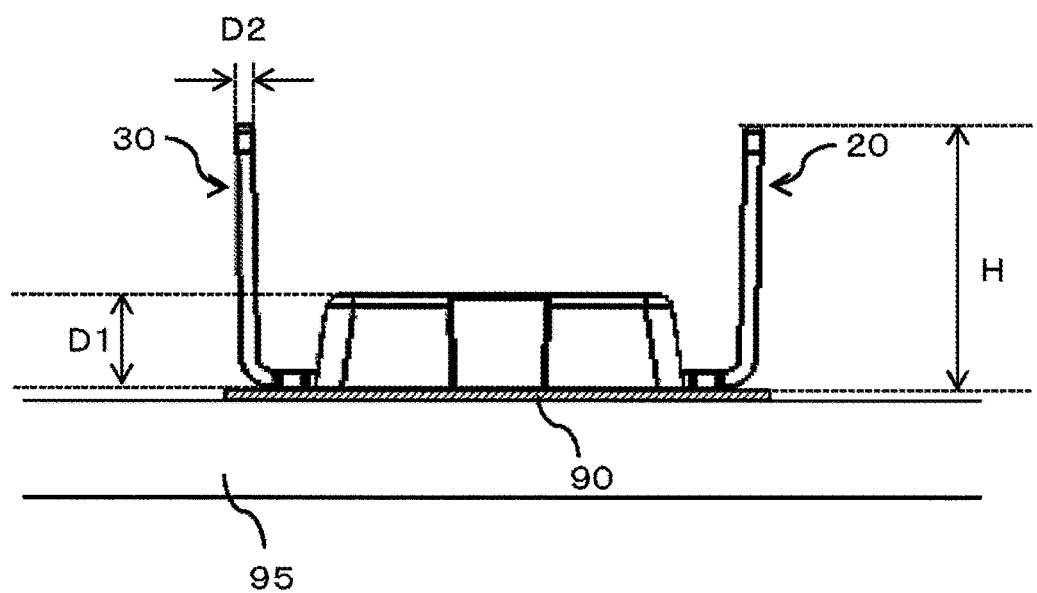
FIG. 8 is a side cross-sectional view illustrating an aspect in which the semiconductor device according to the embodiment of the present invention is placed in a concave portion of a case.

The back surfaces of the first conductor portions 10 and the second conductor portions 20 may be exposed from the sealing portion 50. In this case, the back surfaces of the first conductor portions 10 and the second conductor portions 20 may be partially exposed from the sealing portion 50, or completely exposed therefrom as illustrated in FIGS. 2 and 7. The first conductor portions 10 and the second conductor portions 20 exposed in this way may be placed on a case 95 via a heat radiation sheet 90, a heat radiating adhesive, or the like, as illustrated in FIG. 8. It is to be noted that in the present embodiment, the "back surface" indicates the side illustrated in FIG. 7, and the "front surface" indicates the side opposite to the "back surface".

As illustrated in FIG. 7, the first main body portions 12 and the second main body portions 22 may have a substantially L-shape when viewed from the back surface side. It is to be noted that the "substantially L-shape" just needs to have a portion extending in the vertical direction in FIG. 7 (hereinafter, also referred to as a "vertical bar portion") and a portion extending in the horizontal direction in FIG. 7 (hereinafter, also referred to as a "horizontal bar portion"). Accordingly, a corner thereof may be rounded or a small protrusion or the like may be provided therein.

As illustrated in FIG. 7, each of the plurality of first main body portions 12 may have the same shape when viewed from the back surface. In addition, similarly, each of the plurality of second main body portions 22 may have the same shape when viewed from the back surface. It is to be noted that each of the plurality of first main body portions 12 and the plurality of second main body portions 22 may have the same shape when viewed from the back surface.

As illustrated in FIG. 7, when viewed from the back surface side, the area of the part, exposed from the sealing portion 50, of the first main body portion 12 and the area of the part, exposed from the sealing portion 50, of the second main body portion 22 may be substantially the same. Furthermore, in this case, when viewed from the back surface side, the area of portions for the first terminal 11 and the first main body portion 12 exposed from the back surface of the sealing portion 50 and the area of portions for the second terminal 21 and the second main body portion 22 exposed from the back surface of the sealing portion 50 may be substantially the same. It is to be noted that in the present embodiment, when the "areas" are "substantially the same", it is indicated that the areas are within the range of ±10% of the total area. For example, in a case where the area of the portion of the first main body portion 12 exposed from the back surface is "A1" and the area of the portion of the second main body portion 22 exposed from the back surface is "A2", it is indicated that the areas are $A2 \times 0.9 \leq A1 \leq A2 \times 1.1$. It is to be noted that in the aspect illustrated in FIG. 7, the area A1 of the portion of the first main body portion 12 exposed from the back surface is larger than the area A2 of the portion of the second main body portion 22 exposed from the back surface.

As illustrated in FIGS. 3 and 4, the semiconductor device according to the present embodiment may further have third conductor portions 30. The third conductor portions 30 each have a third terminal 31 and a third main body portion 32 integrated with the third terminal 31. The third conductor portion 30 may be directly connected to the first electronic element 15 as illustrated in FIGS. 4 and 10, or directly connected to the second electronic element 25 as illustrated in FIGS. 3 and 9. It is to be noted that the third terminal 31 may be a ground terminal.

As illustrated in FIGS. 3 and 9, by connecting the first electronic element 15 to the second main body portion 22 and connecting the second electronic element 25 to the third terminal 31, the first terminal 11 can be used as an input terminal, the second terminal 21 as an output terminal, and the third terminal 31 as a ground terminal (refer to FIG. 5). Alternatively, as illustrated in FIGS. 4 and 10, by connecting the second electronic element 25 to the first main body portion 12 and connecting the first electronic element 15 to the third terminal 31, the second terminal 21 can be used as an input terminal, the first terminal 11 as an output terminal, and the third terminal 31 as a ground terminal (refer to FIG. 6).

As illustrated in FIGS. 3 and 4, the semiconductor device according to the present embodiment may have control terminals 41 and 42. In the aspects illustrated in FIGS. 3 and 4, the two control terminals 41 and 42 are used, and the control terminals 41 and 42 are connected to the electronic elements 15 and 16, respectively. In other words, the first control terminal 41 is connected to the first electronic element 15 via the wire 61, and is used for controlling the first electronic element 15. The second control terminal 42 is connected to the second electronic element 25 via the wire 61, and is used for controlling the second electronic element 25.

As illustrated in FIGS. 1, 2 and 8, each of the first terminals 11, the second terminals 21, and the third terminals 31 may be bent toward the front surface side (the sealing portion 50 side). A height H (refer to FIG. 8) of the terminals being bent is, for example, 5 mm to 15 mm (typically approximately 10 mm). A thickness D1 of the sealing portion 50 is 2 mm to 5 mm (typically approximately 3.5 mm). A thickness D2 of each terminal is 0.3 mm to 0.9 mm (typically approximately 0.6 mm). A length L1 (refer to FIG. 7) of the semiconductor device in the longitudinal direction is 40 mm to 50 mm (typically 44 mm). A length (length between the bent portions of the terminals) L2 of the semiconductor device in the transverse direction is 15 mm to 25 mm (typically 20 mm).

In the aspects illustrated in FIGS. 2 and 7, unbent portions of the first terminals 11, the first main body portions 12, unbent portions of the second terminals 21, the second main body portions 22, unbent portions of the third terminals 31, the third main body portions 32, unbent portions of the first control terminals 41, and unbent portions of the second control terminals 42 are flush with each other. Therefore, as described above, when the semiconductor device is placed on the heat radiation sheet 90 (refer to FIG. 8), all of the above-described portions can be brought into contact with the heat radiation sheet 90.

Furthermore, as illustrated in FIGS. 2 and 7, in a case where the first main body portions 12, the unbent portions of the second terminals 21, the second main body portions 22, the unbent portions of the third terminals 31, the third main body portions 32, the unbent portions of the first control terminals 41, and the unbent portions of the second control terminals 42 are completely exposed, all of the above-described portions can be brought into contact with the heat radiation sheet 90. Therefore, there is an advantage that a higher heat radiation effect can be achieved.

As illustrated in FIGS. 3 to 6, the semiconductor device according to the present embodiment may be a three-phase bridge circuit. Any one of the three output terminals may be connected to a U-phase coil, another one to a V-phase coil, and the remaining one to a W-phase coil.

More specifically, in FIG. 5, the drain of the MOSFET serving as the first electronic element 15 is connected to the power supply line side, while the source thereof is connected to the drain of the MOSFET serving as the second electronic element 25. The source of this MOSFET is connected to the ground. In addition, a connection point between the first electronic element 15 and the second electronic element 25 is connected to the U-phase coil, the V-phase coil or the W-phase coil of a motor.

Furthermore, in FIG. 6, the drain of the MOSFET serving as the second electronic element 25 is connected to the power supply line side, while the source thereof is connected to the drain of the MOSFET serving as the first electronic element 15. The source of this MOSFET is connected to the ground. In addition, a connection point between the second electronic element 25 and the first electronic element 15 is connected to the U-phase coil, the V-phase coil or the W-phase coil of the motor.

<<Actions and Effects>>

Next, among the actions and effects of the present embodiment having the above-described configuration, those which have not been described yet will be described.

It is to be noted that any of the aspects described in the "actions and effects" can be adopted with the above configuration.

According to the present embodiment, the usage mode of the first terminal 11 and the second terminal 21 can be selected by changing the connection aspect of the first conductor portion 10 and the second conductor portion 20. In a case where the first terminal 11 is used as a power supply terminal, the second terminal 21 serves as an output terminal (refer to FIG. 5). In a case where the second terminal 21 is used as a power supply terminal, the first terminal 11 serves as an output terminal (refer to FIG. 6). Accordingly, a terminal functioning as a power supply terminal and a terminal functioning as an output terminal can be selected appropriately.

Since a terminal functioning as a power supply terminal and a terminal functioning as an output terminal can be selected appropriately as described above, the entire device such as a controller including the semiconductor device can be assembled easily, and the productivity can be enhanced accordingly. It is to be noted that in a case where the semiconductor device according to the present embodiment serves as a power module, the semiconductor device is connected to a control module. Since a terminal functioning as a power supply terminal and a terminal functioning as an output terminal can be selected appropriately, as in the present embodiment, the degree of freedom of patterning of the control module can be increased.

In the case of adopting the aspect in which the back surfaces of the first conductor portions 10 and the second conductor portions 20 are exposed from the sealing portion 50, a high heat radiation effect can be achieved. Particularly, in the case of adopting the aspect in which the back surfaces of the first conductor portions 10 and the second conductor portions 20 are completely exposed from the sealing portion 50, the entire back surfaces of the first conductor portions 10 and the second conductor portions 20 can be brought into contact with, for example, the heat radiation sheet 90 (refer to FIG. 8). Accordingly, there is an advantage that a higher heat radiation effect can be achieved.

In addition, in the case of adopting the aspect in which the back surfaces of the first conductor portions 10 and the second conductor portions 20 are exposed from the sealing portion 50, there is no need to provide a substrate, and thus the manufacturing cost can be reduced. Particularly, in the case of adopting the aspect in which the back surfaces of the first conductor portions 10 and the second conductor portions 20 are completely exposed from the sealing portion 50, the manufacturing cost can be further reduced.

On the other hand, in order to make the first conductor portions 10 and the second conductor portions 20 hard to be dropped out of the sealing portion 50 with the configuration where the back surfaces of the first conductor portions 10 and the second conductor portions 20 are exposed (completely, in particular) as described above, forming the first conductor portions 10 or the second conductor portions 20 integrally is more advantageous than having the plurality of first conductor portions 10 or the plurality of second conductor portions 20. However, the present embodiment does not take the aspect intentionally in which the first conductor portions 10 and the second conductor portions 20 are each formed integrally, but takes the aspect in which the first conductor portions 10 and the second conductor portions 20 are individually separated. By taking the aspect separated in this way, a terminal functioning as a power supply terminal and a terminal functioning as a output terminal can be selected appropriately, as described above. It is to be noted that in the present embodiment, lead frames are just connected by a tie bar before cutting. Each of the first conductor portions 10, the second conductor portions 20, the third conductor portions 30, the first control terminals 41, and the second control terminals 42 is basically a separate member.

In the three-phase bridge circuit with the configuration where the first conductor portions 10 are integrated or the second conductor portions 20 are formed integrally, there may be the influence of a high-frequency or the like (noise or the like) in another phase. In this respect, as in the present embodiment, adopting the aspect in which each of the first conductor portions 10 and the second conductor portions 20 are separated is advantageous since the influence of a high frequency or the like (noise or the like) in another phase can be reduced.

Particularly, heat can be radiated uniformly by evenly arranging the plurality of electronic elements 15 and 25 as illustrated in FIGS. 3 and 4. Furthermore, by evenly arranging the plurality of electronic elements 15 and 25 in this way, the electronic elements 15 and 25 can be mounted promptly, and the productivity can be enhanced accordingly. "Evenly" in the present embodiment indicates that the distances between the plurality of first electronic elements 15 are the same value, the distances between the plurality of second electronic elements 25 are the same value, the plurality of first electronic elements 15 are arranged on one side (the upper side of FIGS. 3 and 4) with respect to a center line extending in the longitudinal direction (the horizontal direction of FIGS. 3 and 4) of the semiconductor device while the plurality of second electronic elements 25 are arranged on the other side (the lower side of FIGS. 3 and 4), and the first electronic elements 15 and the second electronic elements 25 are arranged in a nested pattern. As an example, the aspect indicated herein is that the plurality of first electronic elements 15 (three in the aspects of FIGS. 3 and 4) are arranged at equal intervals in the horizontal direction on the upper side of FIGS. 3 and 4 with respect to the centerline in the longitudinal direction of the semiconductor device, the plurality of second electronic elements 25 (three in the aspects of FIGS. 3 and 4) are arranged at equal intervals in the horizontal direction on the lower side of FIGS. 3 and 4 with respect to the center line in the longitudinal direction, and the first electronic elements 15 and the second electronic elements 25 are arranged in a nested pattern.

Furthermore, as illustrated in FIGS. 3 and 4, in a case where the wires 61 are adopted, there is an advantage that the wires 61 can be connected efficiently by evenly arranging the plurality of electronic elements 15 and 25.

In using the connectors 62 such as clips, it is necessary to prepare the connectors 62 in advance. However, the types of the connectors 62 to be prepared can be reduced by evenly arranging the plurality of electronic elements 15 and 25. As an example, according to the aspect illustrated in FIG. 9, the length of the connector 62 connecting the first electronic element 15 and the second main body portion 22 and the length of the connector 62 connecting the second electronic element 25 and the third main body portion 32 can be approximately the same. Furthermore, in the aspect illustrated in FIG. 10, the length of the connector 62 connecting the second electronic element 25 and the first main body portion 12 and the length of the connector 62 connecting the first electronic element 15 and the third main body portion 32 can be approximately the same. Therefore, there is an advantage that whichever mode is adopted, the types of connectors 62 to be prepared in advance can be one type. Furthermore, there is also advantage that by using one type of connectors 62, the amount of current flowing through each connector 62 can be approximately the same.

In the case of adopting the aspect in which the first main body portions 12 and the second main body portions 22 have a substantially L-shape when viewed from the back surface side, there is an advantage that another terminal can be provided in a blank portion of the substantially L-shape. Specifically, in FIGS. 3, 4, 9 and 10, the third terminal 31 can be provided on the left side of the vertical bar portion of the first main body portion 12. The second control terminal 42 can be provided on the right side of the vertical bar portion of the second main body portion 22. It is to be noted that in the aspects illustrated in FIGS. 3, 4, 9, and 10, the length of the horizontal bar portion of the second main body portion 22 is shorter than the length of the horizontal bar portion of the first main body portion 12. Accordingly, the first control terminal 41 can be provided on the right side of the second main body portion 22.

In a case where each of the plurality of first main body portions 12 has the same shape when viewed from the back surface side (refer to FIG. 7), there is an advantage that an electrical characteristic can be the same, for example, the amount of current flowing through each of the first main body portions 12 can be the same, while a heat radiation characteristic can also be the same. Similarly, in a case where each of the plurality of second main body portions 22 has the same shape, there is an advantage that an electrical characteristic can be the same, for example, the amount of current flowing through each of the second main body portions 22 can be the same, while a heat radiation characteristic can also be the same.

Furthermore, in a case where each of the plurality of first main body portions 12 and the plurality of second main body portions 22 has the same shape when viewed from the back surface side (refer to FIG. 7), there is an advantage that the electrical characteristic can be the same while a heat radiation characteristic can also be the same between the cases where the first terminal 11 and the second terminal 21 are switched to each other. In other words, there is an advantage that the electrical characteristic can be the same and the heat radiation characteristic can also be the same between the case where the first terminal 11 functions as a power supply terminal and the second terminal 21 functions as an output terminal, and the case where the first terminal 11 functions as an output terminal and the second terminal 21 functions as a power supply terminal.

In a case where the area of the portion of the first main body portion 12 exposed from the back surface and the area of the portion of the second main body portion 22 exposed from the back surface are substantially the same when viewed from the back surface side, there is an advantage that the heat radiation characteristic can be the same therebetween.

In the case of adopting the aspect in which the third terminal 31 is provided, there is an advantage that one more function can be added.

As an example, as illustrated in FIGS. 3 and 9, by connecting the first electronic element 15 to the second main body portion 22 and connecting the second electronic element 25 to the third terminal 31, the first terminal 11 can be used as an input terminal, the second terminal 21 as an output terminal, and the third terminal 31 as a ground terminal. Alternatively, as illustrated in FIGS. 4 and 10, by connecting the second electronic element 25 to the first main body portion 12 and connecting the first electronic element 15 to the third terminal 31, the second terminal 21 can be used as an input terminal, the first terminal 11 as an output terminal, and the third terminal 31 as a ground terminal. As a result, in either case, the current input from one side (the upper side of FIG. 3 and the lower side of FIG. 4) in the transverse direction of the semiconductor device can flow into the other side (the lower side of FIG. 3 and the upper side of FIG. 4) in the transverse direction of the semiconductor device. Therefore, the current does not make a U-turn as in the configuration disclosed in JP 50676791 B1. Accordingly, the wiring length can be reduced, and as a result, an impedance and an inductance can be reduced. Furthermore, the size of the semiconductor device can be reduced, and the cost thereof can also be reduced.

Description of each of the abovementioned embodiments, modifications and disclosure of the drawings are for exemplary purposes so as to illustrate the present invention described in the claims. The present invention described in the claims should not be restricted to the description of each of the abovementioned embodiments or the disclosure of the drawings.

REFERENCE SIGNS LIST

10 First conductor portion
11 First terminal
12 First main body portion
15 First electronic element
20 Second conductor portion
21 Second terminal
22 Second main body portion
25 Second electronic element
30 Third conductor portion
31 Third terminal
32 Third main body portion
50 Sealing portion
61 Wire
62 Connector

What is claimed is:

1. A semiconductor device comprising:
a plurality of first conductor portions, having a first terminal, a first main body portion being integrated with the first terminal and a first electronic element being provided on the first main body portion;
a plurality of second conductor portions, having a second terminal, a second main body portion being is integrated with the second terminal and a second electronic element being provided on the second main body portion; and
a sealing portion, covering upper surface of the first conductor portion and the second conductor portion,
wherein the first conductor portion and the second conductor portion are connected, and
wherein usage mode of the first terminal and the second terminal can be selected by changing connection aspect of the first conductor portion and the second conductor portion, and the second terminal serves as an output terminal in a case where the first terminal is used as a power supply terminal and the first terminal serves as an output terminal in a case where the second terminal is used as a power supply terminal, and
wherein a part of the first main body portion and a part of the second main body portion are exposed from the sealing portion, and an area of the part, exposed from the sealing portion, of the first main body portion and an area of the part, exposed from the sealing portion, of the second main body portion are substantially the same when viewed from back surface.

2. The semiconductor device according to claim 1,
wherein the first terminal and the second terminal are bent toward front surface side, and
wherein the first main body portion, the second main body portion, an unbent portion of the first terminal and an unbent portion of the second terminal are flush with each other on back surface side.

3. The semiconductor device according to claim 1,
wherein a plurality of the first main body portions have the same shape respectively when viewed from back surface, and a plurality of second main body portions have the same shape respectively when viewed from the back surface.

4. The semiconductor device according to claim 1,
wherein a plurality of the first electronic elements and a plurality of the second electronic elements are evenly arranged when viewed from front surface side.

5. The semiconductor device according to claim 1, wherein the first main body portion and the second main body portion have a substantially L-shape when viewed from back surface side.

6. The semiconductor device, according to claim 1, further comprising a third conductor portions, having a third terminal and a third main body portion integrated with the third terminal,
wherein the third conductor portion is directly connected to the first electronic element or the second electronic element.

7. The semiconductor device according to claim 6,
wherein the third terminal is a ground terminal.

8. The semiconductor device according to claim 1,
wherein the first electronic element and the second main body portion are connected via a connector, or the second electronic element and the first main body portion are connected via a connector.

9. The semiconductor device according to claim 8,
wherein lengths of a plurality of the connectors are the same.

* * * * *